(12) United States Patent
Kaneko et al.

(10) Patent No.: US 7,247,985 B2
(45) Date of Patent: Jul. 24, 2007

(54) SEMICONDUCTOR LIGHT-EMITTING DEVICE HAVING ANNULAR SHAPE LIGHT EMITTING REGION AND CURRENT BLOCKING LAYER

(75) Inventors: Kazuaki Kaneko, Nara (JP); Hiroshi Umeda, Nara (JP); Kazuaki Sasaki, Osaka (JP); Junichi Nakamura, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 175 days.

(21) Appl. No.: 10/969,015

(22) Filed: Oct. 21, 2004

(65) Prior Publication Data

US 2005/0093428 A1 May 5, 2005

(30) Foreign Application Priority Data

Oct. 30, 2003 (JP) ............................. 2003-370717
Aug. 18, 2004 (JP) ............................. 2004-238588

(51) Int. Cl.
*H01J 1/62* (2006.01)

(52) U.S. Cl. .................... 313/506; 313/498; 257/79
(58) Field of Classification Search ............... 313/498, 313/506; 257/79, 82, 86, 91, 95
See application file for complete search history.

(56) References Cited

U.S. PATENT DOCUMENTS 6,121,635 A * 9/2000 Watanabe et al. ............ 257/91

2002/0020842 A1 * 2/2002 Sasaki et al. ............... 257/79
2003/0001162 A1 * 1/2003 Udagawa ..................... 257/79

FOREIGN PATENT DOCUMENTS

| JP | HEI 4-229665 | 8/1992 |
| JP | HEI 8-167738 | 6/1996 |
| JP | HEI 11-26810 | 1/1999 |

* cited by examiner

*Primary Examiner*—Joseph Williams
*Assistant Examiner*—Bumsuk Won
(74) *Attorney, Agent, or Firm*—Nixon & Vanderhye, P.C.

(57) ABSTRACT

A semiconductor light-emitting device includes: a semiconductor substrate; a light-emitting layer formed on the semiconductor substrate; a current-blocking layer formed on a part of the light-emitting layer for restricting light-emission; a current-spreading layer formed on the current-blocking layer and the other part of the light-emitting layer; a front electrode formed on the current-spreading layer; and a rear electrode formed on a rear side of the semiconductor substrate. The current-blocking layer is composed of a central region and an outer region which surrounds the central region via a part of the current-spreading layer, so that a light-emitting region that appears on a front surface of the device has an annular shape. The front electrode and the central region of the current-blocking layer are opposed to each other.

8 Claims, 8 Drawing Sheets

W ÷ thickness of P-type current-blocking layer

W2 ÷ W1

( W1: minimum value of distance between inner and outer perimeters of light-emitting region
W2: maximum value of distance between inner and outer perimeters of light-emitting region )

SEMICONDUCTOR LIGHT-EMITTING DEVICE HAVING ANNULAR SHAPE LIGHT EMITTING REGION AND CURRENT BLOCKING LAYER

CROSS-REFERENCE TO RELATED APPLICATION

This application is related to Japanese Patent applications No. 2003-370717 filed on Oct. 30, 2003, and No. 2004-238588 filed on Aug. 18, 2004, whose priorities are claimed under 35 USC §119, the disclosures of which are incorporated by reference in their entirety.

BACKGROUND OF THE INVENTION

1. Field of the Invention

The present invention relates to a semiconductor light-emitting device, and more particularly, to a semiconductor light-emitting device in which a light-emitting region provided on a surface of light-extraction side of the device has an annular shape.

2. Description of Related Art

FIGS. 8 and 9 are a plan view and sectional view of a conventional semiconductor light-emitting device, respectively. FIG. 10 is an explanatory view illustrating a light-emitting state of the conventional semiconductor light-emitting device (see, for example, Japanese Unexamined Patent Publication No. HEI 4(1992)-229665).

In FIGS. 8 to 10, a semiconductor light-emitting device 21 includes: a substrate 23 having an electrode 22 formed on its rear surface, and a lower cladding layer 24a, an active layer 25, an upper cladding layer 24b, a current-spreading layer 29 and an electrode 30 formed in this order on the substrate 23. The lower cladding layer 24a, active layer 25 and upper cladding layer 24b constitute a light-emitting region layer (light-emitting layer) 26. The light-emitting device 21 further includes, in a central region of the current-spreading layer 29, a current-blocking layer 28 formed on the light-emitting region layer 26 side of the layer 29. The current-blocking layer 28 is formed at a position where it opposes the electrode 30 located on the current-spreading layer 29.

Current injected into the current-spreading layer 29 from the electrode 30 spreads to the periphery of the current-blocking layer 28 and is then introduced into the light-emitting region layer 26, so that a light-emitting region 27 emits light. This allows for light-emission in portions other than the portion directly underneath the electrode 30. Consequently, the generated light is not cut off by the electrode 30 and thus, improving the efficiency of the device.

FIGS. 11 and 12 are a plan view and sectional view of another conventional semiconductor light-emitting device, respectively. FIG. 13 is an explanatory view illustrating a light-emitting state of the conventional light-emitting device (see, for example, Japanese Unexamined Patent Publication No. HEI 11(1999)-26810).

In FIGS. 11 to 13, a semiconductor light-emitting device 41 includes: a substrate 43 having an electrode 42 formed on its rear surface, and a lower cladding layer 44a, an active layer 45, an upper cladding layer 44b, a current-spreading layer 49 and an electrode 50 formed in this order on the substrate 43. The lower cladding layer 44a, active layer 45 and upper cladding layer 44b constitute a light-emitting region layer (light-emitting layer) 46. The light-emitting device 41 further includes, in an outer region of the current-spreading layer 49, a current-blocking layer (current-narrowing layer) 48 formed on the light-emitting region layer 46 side of the layer 49. The electrode 50 has an opening in the center thereof and is formed at a position where it opposes the current-blocking layer 48.

Current injected into the current spreading layer 49 from the electrode 50 is concentrated in the middle of the layer 49 and is then introduced into the light-emitting region layer 46, so that a light-emitting region 47 emits light. Since the current is concentrated in the middle of the device, a higher current density is obtained in the middle of the device. As the current density increases, the percentage of current that recombines without emitting light decreases and thus, improving the luminous intensity.

With the structure shown in FIGS. 8 to 10, however, currents spread freely to portions other than the current-blocking layer 28, whereby the density of current decreases.

The structure shown in FIGS. 11 to 13 requires a wire-bonding area 51 to be provided in a corner of the device. The wire-bonding area 51 usually needs a diameter of about 90 μm, and this obstructs reduction in device size.

BRIEF SUMMARY

The present invention provides a semiconductor light-emitting device in which the density of current introduced into the light-emitting layer is increased to improve the luminous intensity and to achieve uniform light-emission, and in which wire-bonding area is not required and hence, miniaturization of the device is possible.

A semiconductor light-emitting device comprises: a semiconductor substrate; a light-emitting layer formed on the semiconductor substrate; a current-blocking layer formed on a part of the light-emitting layer for restricting light-emission; a current-spreading layer formed on the current-blocking layer and the other part of the light-emitting layer; a front electrode formed on the current-spreading layer; and a rear electrode formed on a rear side of the semiconductor substrate, wherein the current-blocking layer is composed of a central region and an outer region which surrounds the central region via a part of the current-spreading layer, so that a light-emitting region that appears on a front surface of the device has an annular shape, and the front electrode and the central region of the current-blocking layer are opposed to each other.

In accordance with an example embodiment, the current-blocking layer comprises the central and outer regions, so that the light-emitting region that appears on the front surface of the device is defined between the central and outer regions to have an annular shape. This allows for improved luminous intensity over devices that do not include the outer region of the current-blocking layer, and for uniform light-emission.

By disposing the front electrode in opposed relation with the central region of the current-blocking layer, there is no need to provide a wire-bonding area in the outer region of the current-blocking layer and thus, the semiconductor light-emitting device can be miniaturized.

DESCRIPTION OF THE PREFERRED EMBODIMENTS

Figure 1:
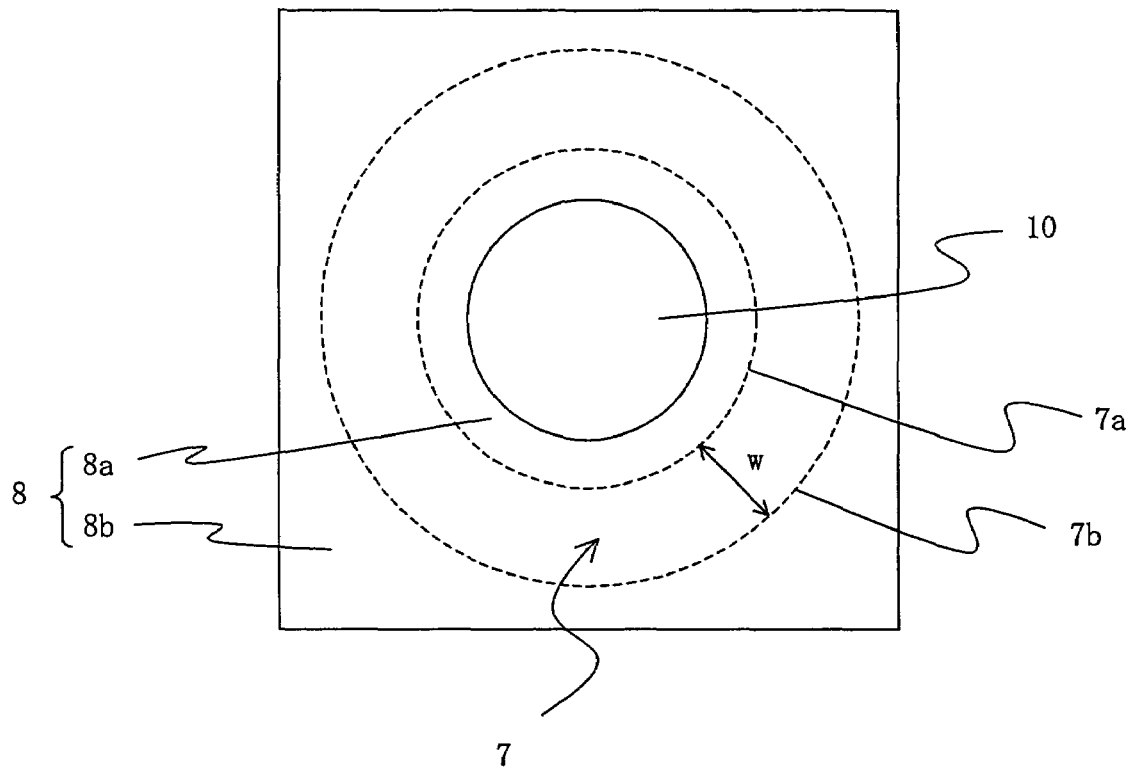
FIG. 1 is a plan view illustrating the general construction of a semiconductor light-emitting device according to a first example embodiment.
Figure 2:
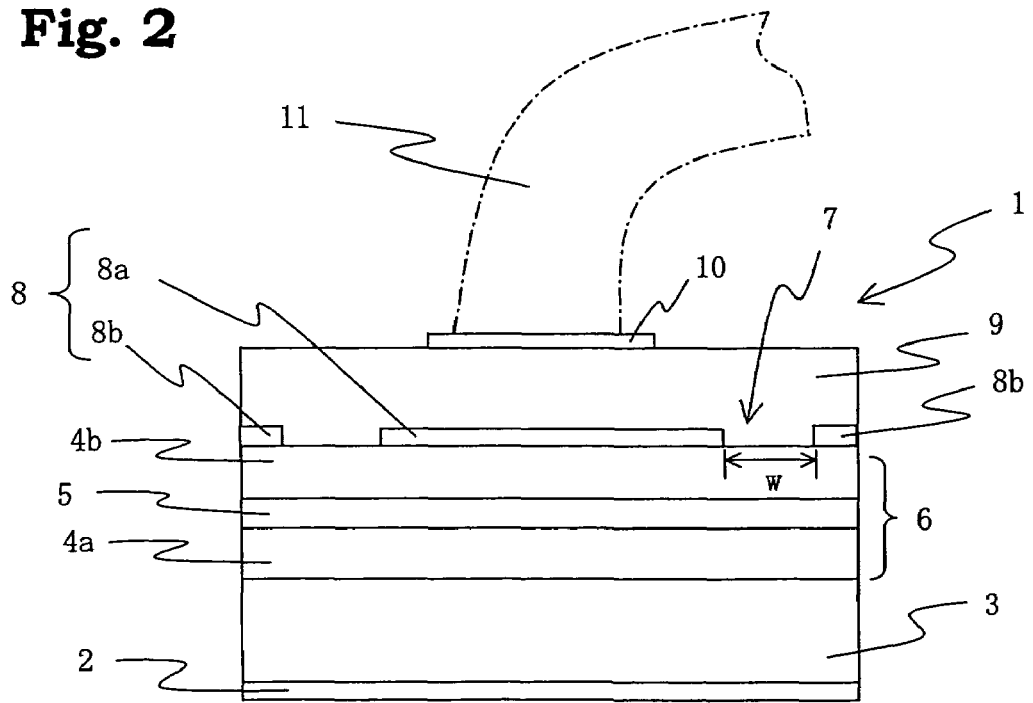
FIG. 2 is a sectional view of the device of FIG. 1.

A semiconductor light-emitting device according to example embodiment comprises: a semiconductor substrate; a light-emitting layer formed on the semiconductor substrate; a current-blocking layer formed on a part of the light-emitting layer for restricting light-emission; a current-spreading layer formed on the current-blocking layer and the other part of the light-emitting layer; a front electrode formed on the current-spreading layer; and a rear electrode formed on a rear side of the semiconductor substrate.

According to the present invention, the semiconductor substrate may be any as long as the light-emitting layer (hereinafter also referred to as a light-emitting region layer) can be formed thereon. The substrate preferably lattice-matches the light-emitting layer. Examples of the substrate include substrates of compound semiconductors such as GaAs, GaN, GaP, InP, ZnO and ZnSe, and of elementary semicondutors such as Si and Ge. The substrate may have n- or p-type conductivity.

The rear electrode (may be referred to as a substrate-side electrode) may be formed of a conductive material, and preferably has an ohmic contact with the substrate. The rear electrode may be formed of, for example, a metal such as Au, Pt, Al, Ni or Ti, or an alloy such as AlGe or AlZn. For example, where the substrate is of n-type semiconductor, an AlGe electrode is preferably used.

The rear electrode may be formed by, for example, forming a metal or alloy film by means of vapor deposition, sputtering or the like, followed by a heat treatment of the film. The rear electrode may be formed on a side or rear surface of the substrate.

Between the rear electrode and the substrate, a contact layer, for example, may be provided for obtaining an ohmic contact.

The light-emitting layer formed on the substrate may be any as long as it emits light by passing a current thereto. The light-emitting layer preferably has a double heterojunction structure of a lower cladding layer, active layer and upper cladding layer, but may have a single heterojunction structure or homojunction structure.

Semiconductor layers that constitute the light-emitting layer may be formed of, for example, a compound semiconductor. Examples of the compound semiconductor include a binary compound semiconductor such as GaAs, GaP or GaN, a ternary compound semiconductor such as AlInP, AlGaAs, GaAsP, InGaAs or InGaN, and a quaternary compound semiconductor such as InGaAsP or AlGaInP. The composition of the compound semiconductor may be determined so as to obtain light of a desirable wavelength.

Where the light-emitting layer has the double heterojunction structure, for example, the composition of the compound semiconductor used for the active layer is determined so as to obtain light of a desirable wavelength. The compositions of the lower and upper cladding layers are determined so that the band gaps thereof are greater than that of the active layer.

The light-emitting layer of any of the double heterojunction, single heterojunction or homojunction structure comprises two or more semiconductor layers. The lowermost layer of the semiconductor layers has the same conductivity type as the substrate, and the uppermost layer of the semiconductor layers has a different conductivity type from the substrate. The active layer of the double heterojunction structure may be undoped or doped with n-type or p-type impurities.

Each semiconductor layer that constitutes the light-emitting layer may be formed by a method such as LPE, MOCVD, MBE or MOMBE. The semiconductor layer of n-type may be formed by doping Si, S, Se, Te or the like, and the semiconductor layer of p-type may be formed by doping Zn, Mg, C, Be or the like.

Other semiconductor layers such as the contact layer, a buffer layer, a cap layer, the current-blocking layer and the current-spreading layer which will be described later may be formed by similar methods.

Between the rear electrode and the light-emitting layer, the buffer layer, for example, may be provided for offsetting the difference in lattice constant.

The current-blocking layer is formed on a part of the light-emitting layer for restricting light-emission, and current-spreading layer is formed on the current-blocking layer and the other part of the light-emitting layer. The current-blocking layer may be any as long as it prevents, or makes difficult, the flowing of currents from the current-spreading layer to the light-emitting layer. The current-blocking layer may be formed of, for example, a semiconductor which is doped with impurities of different conductivity type from the uppermost layer of the light-emitting layer or which has a small carrier concentration. Examples of such a semiconductor include GaP, AlGaP, AlGaAs and AlGaInP.

The current-blocking layer may also be formed of a semiconductor which has the same conductivity type as the uppermost layer of the light-emitting layer and which allows a heterobarrier formed between the current-blocking layer and the uppermost layer of the light-emitting layer to be greater than that formed between the current-spreading layer and the uppermost layer. For example, the uppermost layer of the light-emitting layer, current-blocking layer and current-spreading layer may be formed of p-type AlGaInP, p-type GaAs and p-type GaAlAs, respectively.

The current-spreading layer may be any as long as it spreads current fed from the front electrode. The current-spreading layer is preferably formed of a material having a band gap greater than the energy of light generated in the light-emitting layer so that the light generated in the light-emitting layer is less absorbed. Further, the current-spreading layer is preferably formed of a material having a small resistivity so as to facilitate the current spreading.

The current-spreading layer may be formed of, for example, a compound semiconductor. Examples of the compound semiconductor include a binary compound semiconductor such as GaP, a ternary compound semiconductor such as GaAlAs or InGaN, and a quaternary compound semiconductor such as AlGaInP or AlGaInN. The current-spreading layer preferably has the same conductivity type as the uppermost layer of the light-emitting layer.

According to an example embodiment, the current-blocking layer is composed of a central region and an outer region surrounding the central region via a part of the current-spreading layer, so that a light-emitting region that appears on a front surface of the semiconductor light-emitting device has a circular shape.

Normally, the current-blocking layer is formed on the light-emitting layer prior to the formation of the current-spreading layer. The current-blocking layer is formed such that an annular opening is formed between its central and outer regions. The annular opening may be formed by partially removing the current-blocking layer that is formed on the entire surface of the light-emitting layer by means of photolithography and etching. The term "annular" used herein includes a circular shape, a polygonal shape, and a ring- or loop-shape obtained from a rounded polygon. The "opening" is preferably a through hole, but may be a blind hole. Where the "opening" is a blind hole, a semiconductor which forms the current-spreading layer is filled in the annular opening, that is, between the central and outer regions.

Instead of forming the annular opening in the current-blocking layer as described above, an annular current-flow-through region may be formed. For example, a semiconductor doped with impurities of different conductivity type from the uppermost layer of the light-emitting layer or a semiconductor having a small carrier concentration, such as GaP, AlGaAs or AlGaInp may be used to form the current-blocking layer. Then, impurities of the same conductivity type as the uppermost layer may be annularly diffused to form the annular current-flow-through region.

Alternatively, a semiconductor layer in which current can easily flow may be formed. Then, the layer may be doped with impurities of different conductivity type from the uppermost layer except for a portion to serve as the annular current-flow-through region.

Between the current-blocking layer and the light-emitting layer, the cap layer may be formed. Where the uppermost layer of the light-emitting layer is formed of an easily oxidizable material, for example, the cap layer may be formed of an oxidation-resistant material. The cap layer may be formed of, for example, a material that does not contain aluminum, such as GaInP. The cap layer may also be formed of a material having a small aluminum content.

According to an example embodiment, the central region of the current-blocking layer and the front electrode (may also be referred to as a light-extraction side electrode) are opposed to each other.

The front electrode may be formed of a conductive material, and is preferably capable of forming an ohmic contact with the current-spreading layer. The front electrode may be formed of, for example, a metal such as Au, Pt, Al, Ni or Ti, or an alloy such as AlGe or AlZn. Where the substrate is of p-type semiconductor, an AlZn electrode is preferably used.

The front electrode may be formed by, for example, forming a metal or alloy film by means of vapor deposition, sputtering or the like, and then processing the film into a desirable shape by photolithography and etching techniques, followed by heat treatment.

The front electrode may have any shape and size, and preferably has such shape and size that a wire-bonding area can be provided thereon. The front electrode preferably has a circular shape, and a radius of 45 μm or greater so that a space for wire bonding is secured. In order to provide enough space therefor, it is more preferable that the front electrode has a radius of 50 μm or greater.

Between the substrate and the front electrode, the contact layer formed of, for example, GaAs may be provided for obtaining an ohmic contact.

According to an example embodiment, as described above, the current-blocking layer is composed of the central region and the outer region surrounding the central region via a part of the current-spreading layer so that a light-emitting region that appears on the front surface of the light-emitting device has an annular shape. Here, the outer contour (outer perimeter) of the front electrode is preferably set to have a size substantially equal to that of the inner contour (inner perimeter) of the light-emitting region or a size such that the outer contour of the front electrode falls within the inner contour of the light-emitting region (i.e., the outer contour of the front electrode is smaller than the inner contour of the light-emitting region). This is because, when the front electrode is larger than the inner contour of the light-emitting region, the light-emitting layer emits light under the front electrode, and the emitted light is shielded by the front electrode, preventing the light from being taken outside.

The outer contour of the front electrode is preferably set such that the width between the outer contour of the front electrode and the inner contour of the light-emitting region is substantially uniform. By doing so, driving current is uniformly fed into the light-emitting layer.

In terms of formability, the light-emitting region preferably has a circularly annular shape and the front electrode preferably has a circular shape. The difference in radius between the outer perimeters of the light-emitting region and the front electrode is preferably 7.1 to 10.7 times the thickness of the current-spreading layer. Further, it is preferable that the distance between the inner and outer perimeters of the light-emitting region, that is, the width of the light-emitting region is 25 μm or greater. The ratio of the maximum to minimum values of this distance is preferably 1.4 times or smaller.

The radius of the inner perimeter of the circularly annular light-emitting region is preferably 1.3 to 1.7 times the radius of the outer perimeter of the front electrode. Where the ratio is less than 1.3, a highly-developed alignment technique is required at the formation of the front electrode, and thereby the production efficiency of the device decreases. Where the ratio is more than 1.7 times, the area of the device that does not contribute to light-emission increases, resulting in an increase in device area. This reduces the number of devices produced per unit area of a wafer.

Preferably, the width of the annular light-emitting region is substantially uniform. By doing so, driving current is uniformly fed into the light-emitting layer.

The width of the annular light-emitting region is preferably 25 μm or greater as described above, and more preferably from 25 μm to 40 μm inclusive. Where the width is smaller than 25 μm, there is a fear that etching irregularities may be caused, which leads to a malfunction of the device. Where the width is larger than 40 μm, there is a fear that luminous intensity may decrease due to variations in current density in the light-emitting region.

The outer contour (outer boundary or outer perimeter) of the light-emitting region (annular opening) is preferably 20 μm or more apart from the outer contour of the semiconductor substrate, and more preferably, from 15 μm or more to 40 μm or less apart from the outer contour of the substrate. Where the distance between the two is less than 15 μm, there is a higher possibility of cutting the annular opening when separating chips, resulting in a decrease in production efficiency. Where the distance between the two is more than 40 μm, the area of the device that does not contribute to light-emission increases, resulting in an increase in device area. This reduces the number of devices produced per unit area of a wafer.

The semiconductor light-emitting device of an example embodiment may further include a bonding wire connected to the front electrode. Since the front electrode is provided in opposed relation with the central region of the current-blocking layer, there is no need for providing a wire bonding area in peripheral portions of the semiconductor light-emitting device such as the outer region of the current-blocking layer, whereby the size of the device can be reduced.

With reference to the attached drawings, example embodiments will hereinafter be described by way of embodiments thereof. It should be understood that the present invention be not limited to these embodiments.

First Embodiment

FIG. 1 illustrates a first example embodiment. A semiconductor light-emitting device 1 of the first embodiment includes an n-type GaAs substrate 3 having an n-type AuGe electrode 2. The device 1 also includes, in the order recited, a light-emitting region layer 6 serving as a light-emitting layer, a p-type AlGaInP current-spreading layer 9 and a p-type AuZn electrode 10 serving as a light-extraction side electrode (front electrode). The light-emitting region layer 6 is composed of an n-type AlInP lower cladding layer 4a, an AlGaInP active layer 5 and a p-type AlInP upper cladding layer 4b successively formed on the substrate 3. Inside the current-spreading layer 9, an n-type GaP current-blocking layer 8 is partially formed on the light-emitting region layer 6 side of the layer 9, for restricting light-emission. The current-blocking layer 8 is composed of a central region 8a and an outer region 8b surrounding the central region 8a via the current-spreading layer 9. A light-emitting region 7 that appears on the surface of light-extraction side of the device has an annular shape.

The p-type electrode 10 is disposed in opposed relation with the central region 8a of the layer 8, and has a bonding wire 11 connected thereto.

The thickness, composition and carrier concentration of each layer are set as follows: n-type GaAs substrate 3 (130 μm, $3 \times 10^{18}$ cm$^{-3}$); n-type AlInP lower cladding layer 4a (1 μm, $Al_{0.5}In_{0.5}P$, $5.0 \times 10^{17}$ cm$^{-3}$); AlGaInP active layer 5 (0.5 μm, $(Al_{0.05}Ga_{0.95})_{0.5}In_{0.5}P$, undoped); p-type AlInP upper cladding layer 4b (1 μm, $Al_{0.5}In_{0.5}P$, $5.0 \times 10^{17}$ cm$^{-3}$); n-type GaP current-blocking layer 8 (0.3 μm, GaP, $1.0 \times 10^{18}$ cm$^{-3}$); and p-type AlGaInP current-spreading layer 9 (7 μm, $Al_{0.01}Ga_{0.98}In_{0.01}P$, $1.0 \times 10^{18}$ cm$^{-3}$). Silicon and zinc are used as n-type and p-type impurities, respectively.

The n-type GaAs substrate 3 has outer dimensions of 280 μm×280 μm. The n-type electrode 2 is formed on the entire rear surface of the substrate 3. The p-type electrode 10 is formed circularly on the center of the p-type AlGaInP current-spreading layer 9 to have a radius of 50 μm.

Next, with reference to FIG. 1, an explanation will be given on a manufacturing method of the semiconductor light-emitting device of the first embodiment. The thickness, composition and carrier concentration of each layer are as described above.

On the n-type GaAs substrate 3, the light-emitting region layer 6 comprising the n-type AlInP cladding layer 4a, p-type AlGaInP active layer (light-emitting layer) 5 and p-type AlInP cladding layer 4b, and the n-type GaP current-blocking layer 8 are formed in this order by vapor-phase epitaxy using an MOCVD apparatus. After the completion of epitaxial growth, the substrate 3 on which the multilayer film is formed is temporarily taken out from the MOCDV apparatus.

Next, an annular opening for forming the above-mentioned light-emitting region 7 therein is formed in the current-blocking layer 8 by means of photolithography and etching techniques. In other words, the current-blocking layer 8 is designed to be composed of the central region 8a and the outer region 8b surrounding the central region via the annular opening. An etching solution containing sulfuric acid is used for etching. Then, a resist is removed, and the MOCVD apparatus is used on the substrate 3 having the multilayer film formed thereon to form the current-spreading layer 9 on the current-blocking layer 8 including the annular opening by vapor-phase epitaxy.

Subsequently, the circular p-type AuZn electrode 10 having a radius of 50 μm is formed on the current-spreading layer 9. Then, the substrate 3 is processed to have a thickness of 130 μm. The n-type AuGe electrode 2 is then formed on the rear surface of the substrate 3, followed by a heat treatment, to complete the semiconductor light-emitting device. Still after this, the bonding wire 11 is connected to the electrode 10.

Hereinafter, examined are variations in luminous intensity when the difference in radius between the outer perimeters of the light-emitting region and the electrode 10 is changed. The difference in radius is changed such that it becomes multiples of the thickness of the current-spreading layer 9.

The radius of a circle defined by the inner contour (inner perimeter or inner boundary) 7a of the light-emitting region (annular opening) 7 is fixed to 80 μm, and the size of a circle defined by its outer contour (outer perimeter or outer opening) 7b is changed, to form semiconductor light-emitting devices having light-emitting regions of four different widths and a semiconductor light-emitting device having a light-emitting region of different shape. More specifically, the light-emitting regions having four different widths are formed by making the difference in radius between the outer perimeters of the light-emitting region 7 and the electrode 10 be 7.1 times, 9.3 times, 10.7 times and 12.1 times the thickness of the current-spreading layer 9.

Figure 3:
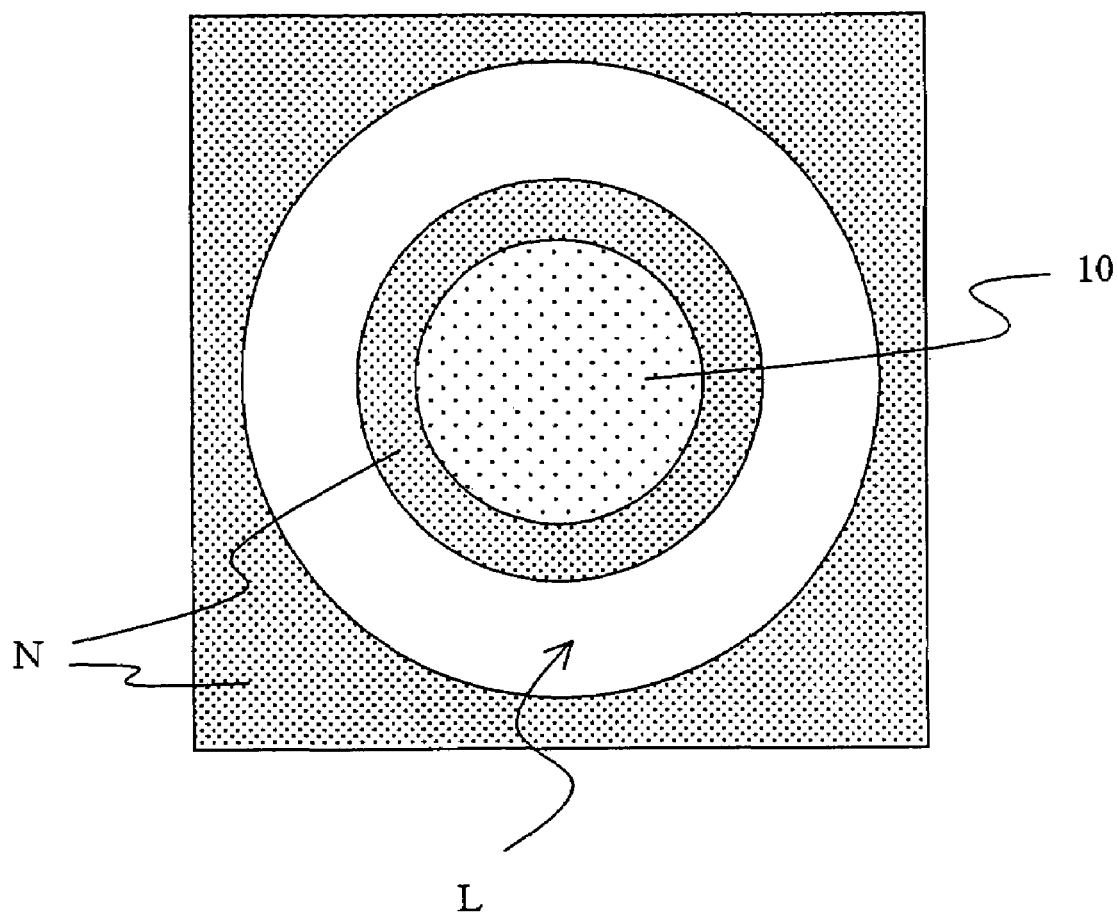
FIG. 3 is an explanatory view illustrating a light-emitting state of the top of the device of FIG. 1.

Thus, as shown in FIG. 3, seen on the light-extraction side of the device is an annular light-emitting region L surrounded by a region N comprising the central and outer regions 8a, 8b of the non-light-emitting current-blocking layer. Reference numeral 10 denotes the light-extraction side electrode which is opposed to the central region.

Figure 4:
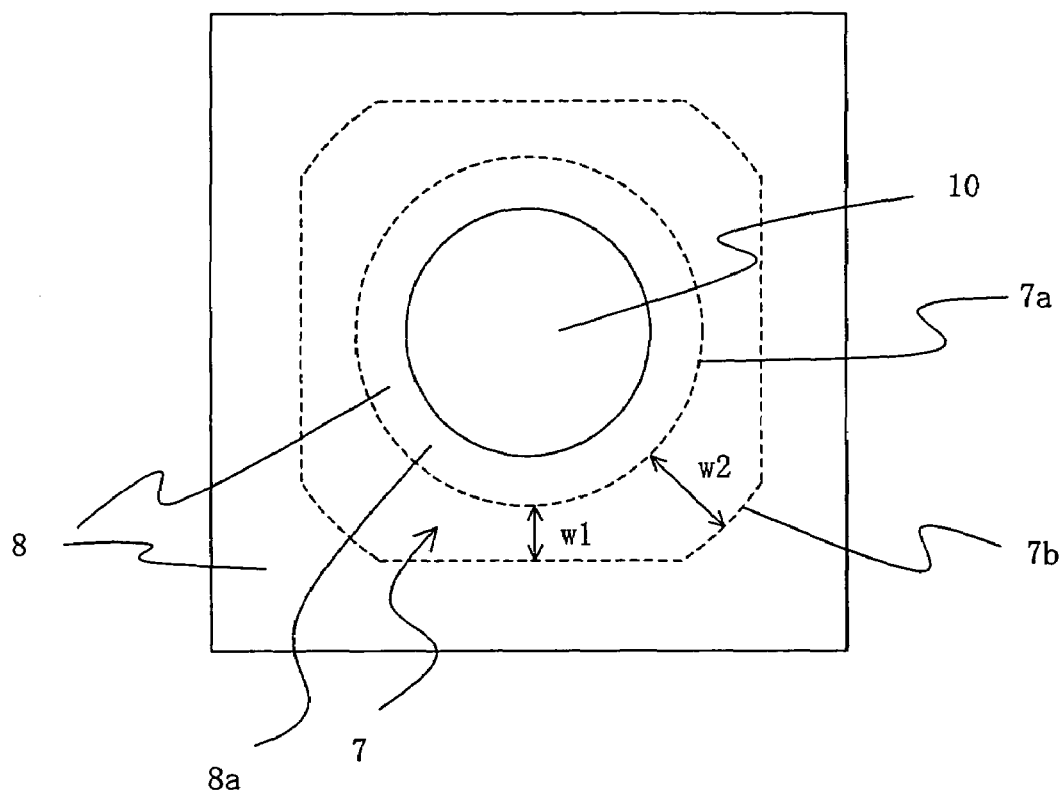
FIG. 4 is a plan view illustrating the general construction of a semiconductor light-emitting device according to another example embodiment.

Further, as shown in FIG. 4, the light-emitting region having a quasi-ring-form outer perimeter (outer boundary) 7b is formed by making the edges of a square arced. The edges of the outer perimeter 7b are chamfered such that the difference between the side length of the square (with unchamfered edges) and the radius of the outer perimeter of the electrode 10 is 7.8 times the thickness of the current-spreading layer 9, and the difference in radius between the outer circle 7b and the p-type electrode 10 is 10.7 times the thickness of the current-spreading layer 9.

Figure 5:
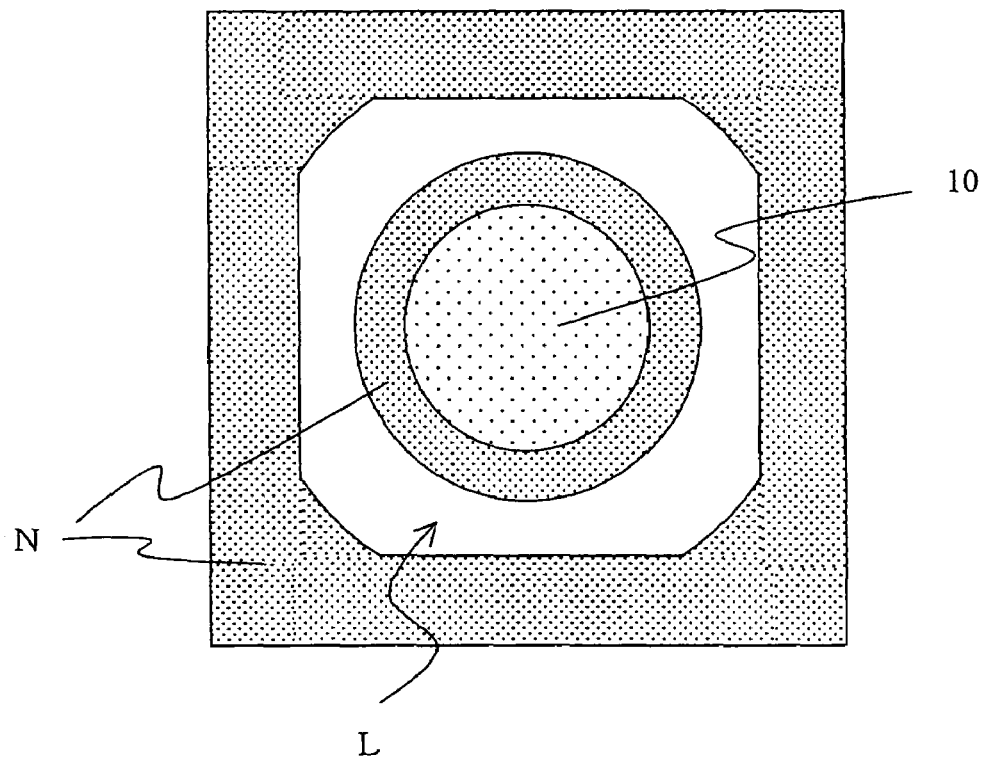
FIG. 5 is an explanatory view illustrating a light-emitting state of the top of the device of FIG. 4.

A current of 20 mA is fed to each of the semiconductor light-emitting devices having the above-mentioned five types of opening, and their luminous intensities are measured. As shown in FIG. 5, seen on the light-extraction side of the device is the annular light-emitting region L surrounded by the region N comprising the central and outer regions 8a, 8b of the non-light-emitting current-blocking layer. Reference numeral 10 denotes the light-extraction side electrode which is opposed to the central region 7a.

Figure 8:
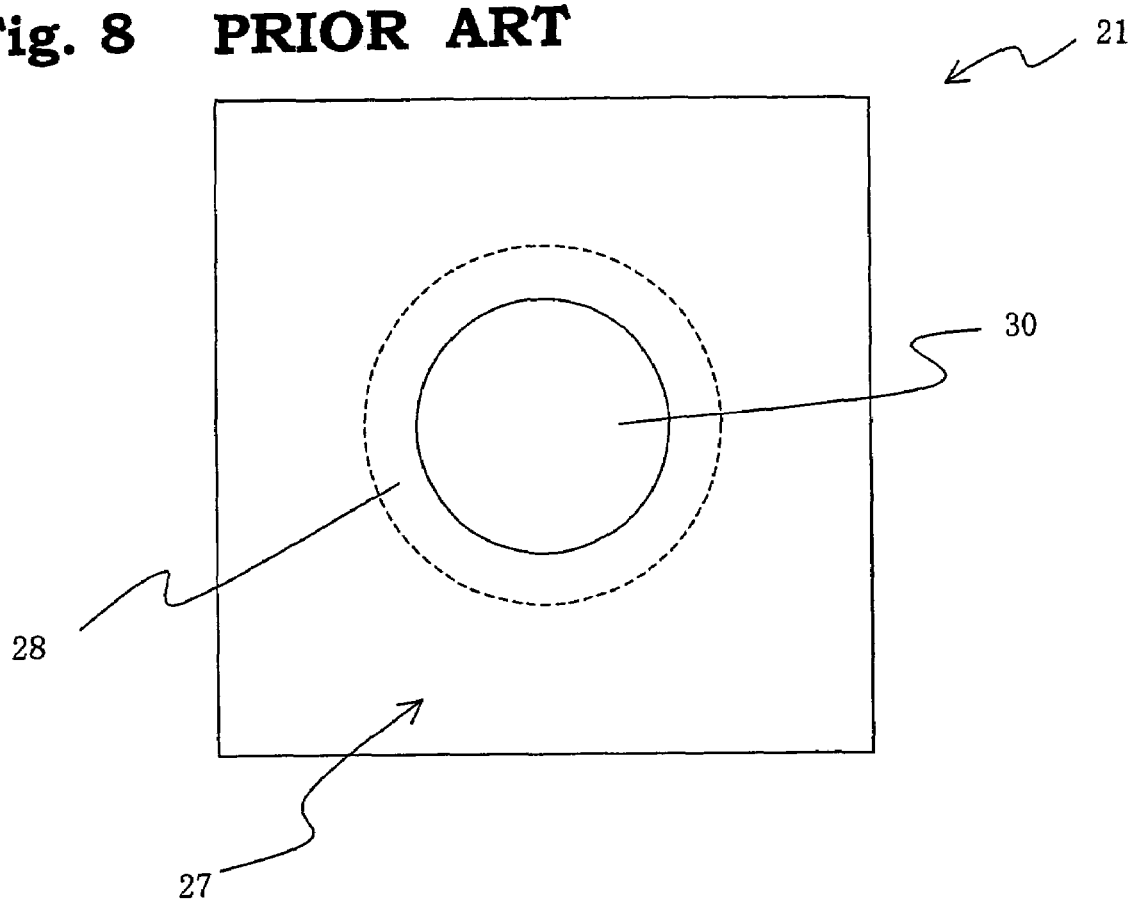
FIG. 8 is a plan view illustrating the general construction of a conventional semiconductor light-emitting device.
Figure 9:
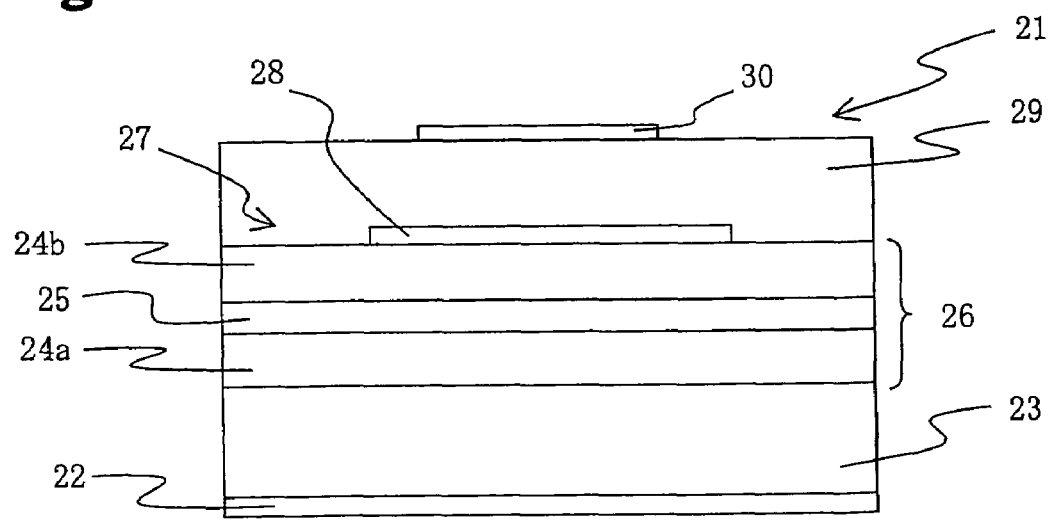
FIG. 9 is a sectional view of the device of FIG. 8.
Figure 10:
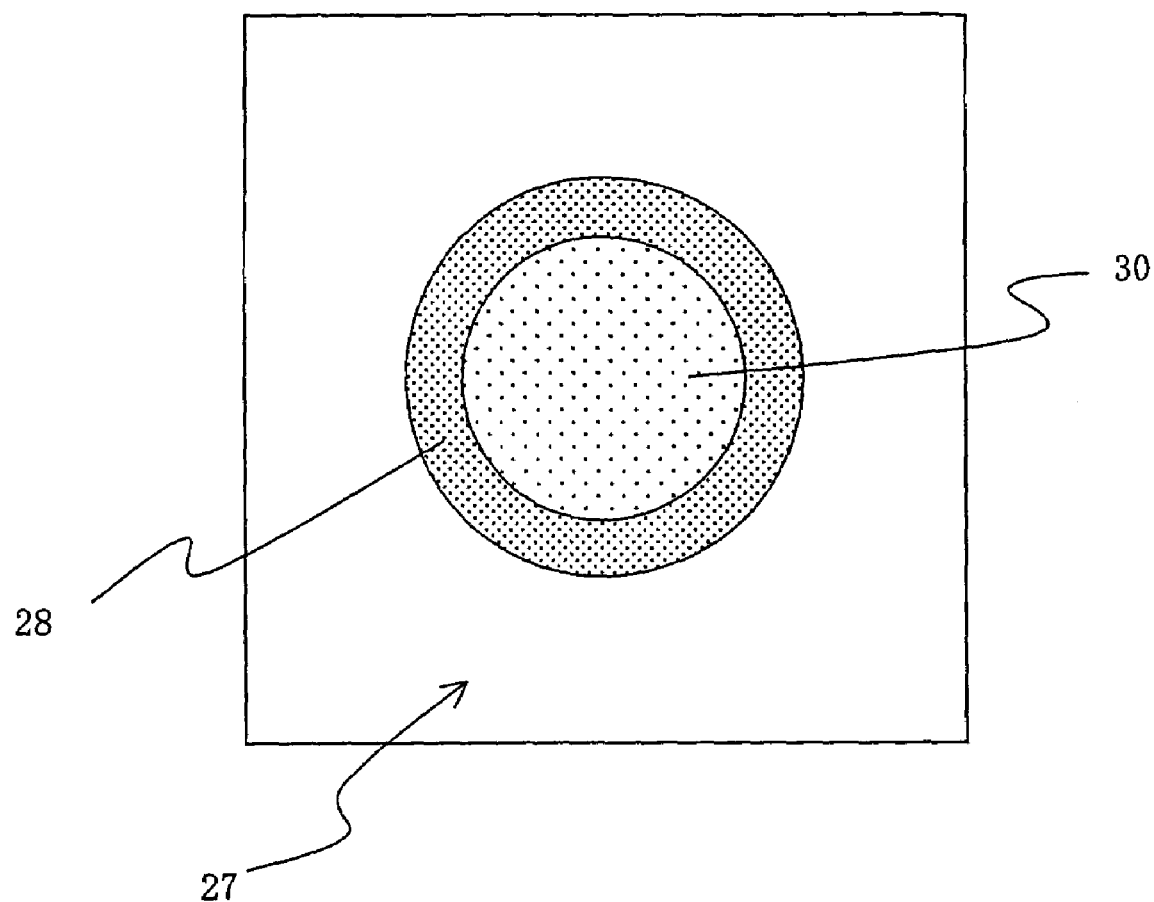
FIG. 10 is an explanatory view illustrating a light-emitting state of the top of the device of FIG. 8.
Figure 11:
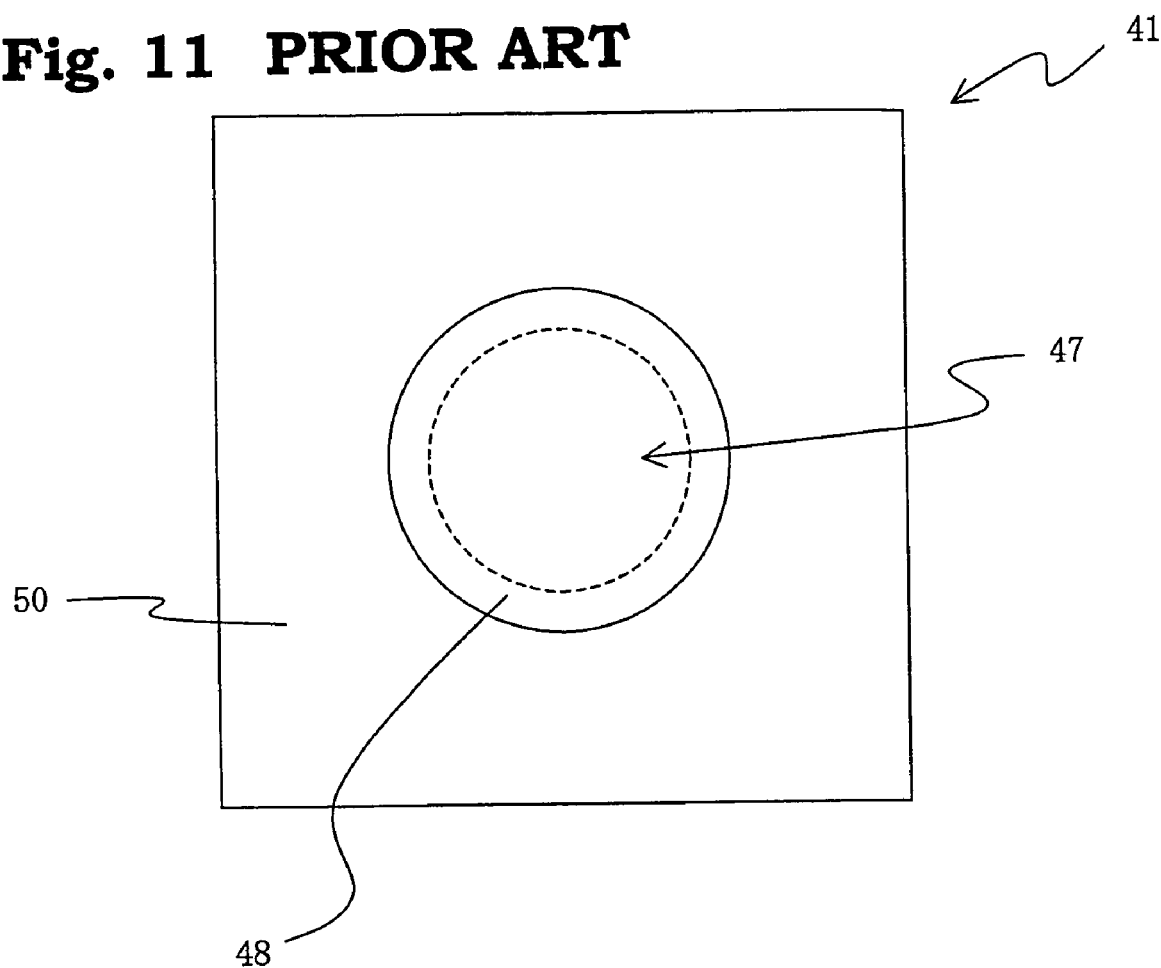
FIG. 11 is a plan view illustrating the general construction of another conventional semiconductor light-emitting device.
Figure 12:
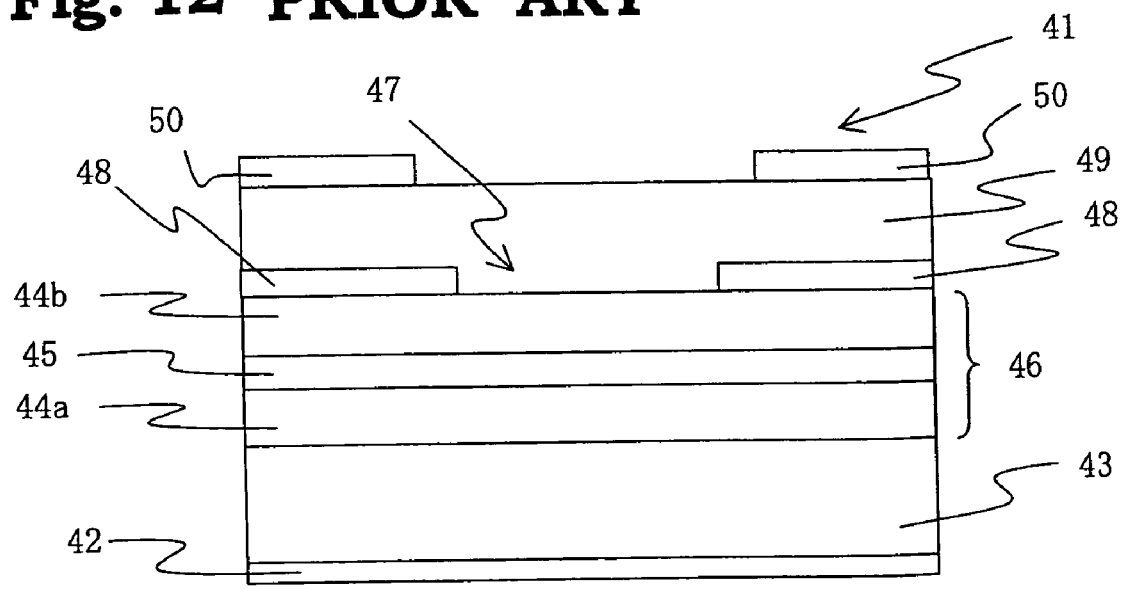
FIG. 12 is a sectional view of the device of FIG. 11.
Figure 13:
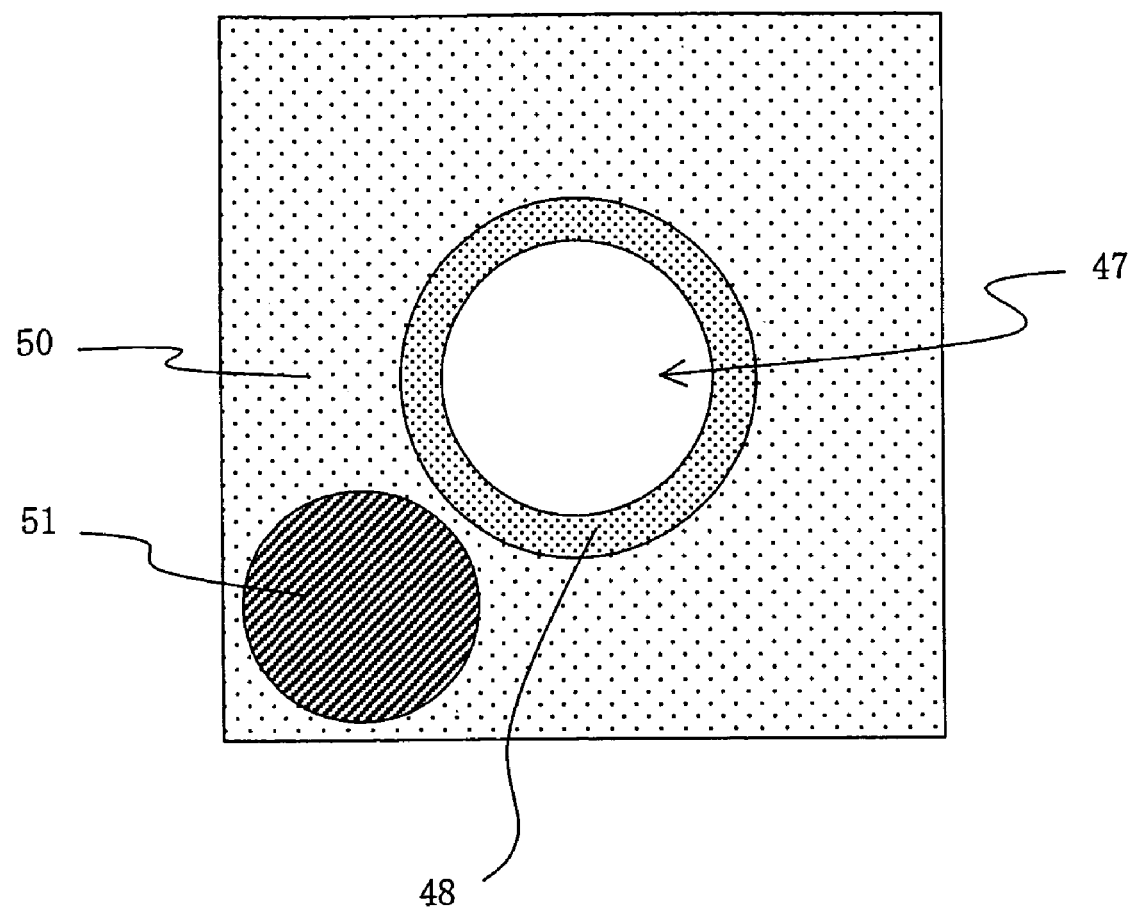
FIG. 13 is an explanatory view illustrating a light-emitting state of the top of the device of FIG. 11.

A semiconductor light-emitting device of a conventional type shown in FIG. 8, which has no current-blocking layer in the outer region of a current-spreading layer is produced under the same conditions as above, and the luminous intensity thereof is also measured under the same conditions as above.

Figure 6:
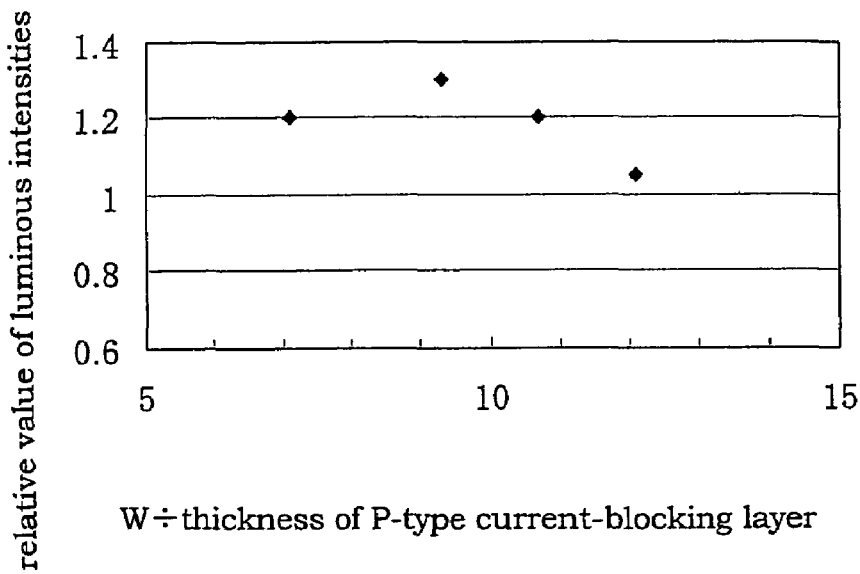
FIG. 6 is a graph illustrating a relationship between the width of a light-emitting region (annular opening) of the device according to the present invention and the ratio of the luminous intensity of the device according to the first embodiment to that of a conventional light-emitting device.

The results of the measurements are shown in FIG. 6. The horizontal axis in FIG. 6 represents a number with which the thickness of the p-type current-spreading layer is multiplied to give the width (W) of the light-emitting region. The vertical axis in FIG. 6 represents a relative value of the luminous intensity of the device according to the present invention with respect to that of the conventional semiconductor light-emitting device. The luminous intensity improves 1.2 times, 1.3 times, 1.25 times and 1.05 times when the difference in radius between the outer perimeters of the light-emitting region 7 and electrode 10 is 7.1 times, 9.3 times, 10.7 times and 12.1 times the thickness of the current-spreading layer 9, respectively. Further, the luminous intensity improves 1.25 times when the device has the quasi-ring-form light-emitting region. As a result, it is found that, when the difference is 7.1 times to 10.7 times the thickness of the current-spreading layer 9, the current density becomes sufficiently high and the luminous intensity greatly improves over the conventional device (for example, 13% increase).

With the quasi-ring-form light-emitting region, an improvement in luminous intensity is observed. When the width of the arced edges which form the quasi-ring-form is 25 μm or larger, it is found that uniform light-emission and an improvement in luminous intensity are achieved. When the width of the arced edges is in the range of 25 μm to 35 μm, light-emission is more uniform and luminous intensity is further improved.

Figure 7:
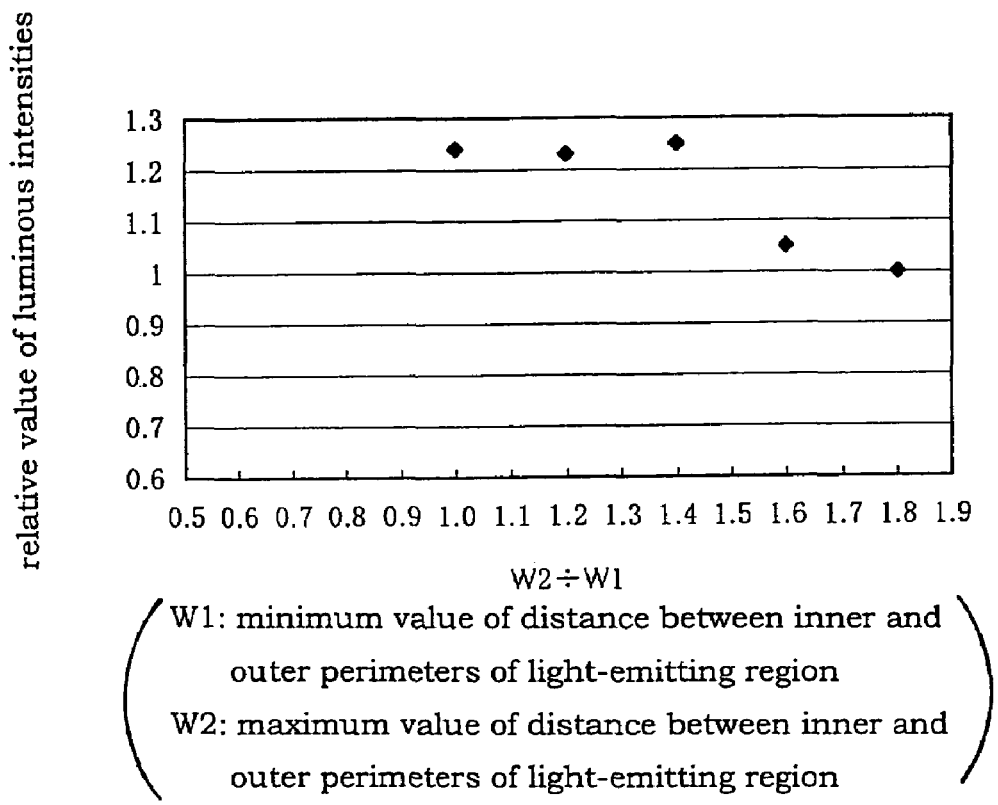
FIG. 7 is a graph illustrating a relationship between the ratio of maximum to minimum values of the width of a light-emitting region (annular opening) of the device according to the present invention and the ratio of the luminous intensity of the device according to the second embodiment to that of the conventional semiconductor light-emitting device.

Further, in FIG. 7, the horizontal axis represents a ratio between the maximum value (W2) and minimum value (W1) of the width of the light-emitting region (annular opening), and the vertical axis represents a relative value of the luminous intensity of the device according to the present invention with respect to that of the conventional semiconductor light-emitting device. When the ratio between the maximum and minimum values (W2 and W1) is 1.6 and 1.8, the relative value of the luminous intensities is 1.05 and 1.00, respectively. When the ratio between the maximum and minimum values (W2 and W1) is 1.0, 1.2 and 1.4, the relative value of the luminous intensities are 1.24, 1.23 and 1.25, respectively. As a result, when the width of the arced edges which form the quasi-ring-form (the distance between the inner and outer perimeters of the edge of the light-emitting region) is 25 μm or larger and the ratio between the maximum and minimum values of the width is 1.4 times or lower, a 1.2 times improvement in luminous intensity is observed.

In this embodiment, a AlGaInP-based semiconductor light-emitting device is used, but as the present invention relates to the structure of a light-emitting device, the similar effects can be achieved even with the use of a GaAlAs-based or GaN-based semiconductor light-emitting device or the like.

What is claimed is:

1. A semiconductor light-emitting device comprising:
    a semiconductor substrate;
    a light-emitting layer formed on the semiconductor substrate;
    a current-blocking layer formed on a part of the light-emitting layer for restricting light-emission;
    a current-spreading layer formed on the current-blocking layer and the other part of the light-emitting layer;
    a front electrode formed on the current-spreading layer;
    a rear electrode formed on a rear side of the semiconductor substrate,
    wherein the current-blocking layer is composed of a central region and an outer region which surrounds the central region via a part of the current-spreading layer, so that a light-emitting region that appears on a front surface of the device has an annular shape;
    wherein the front electrode and the central region of the current-blocking layer are opposed to each other,
    wherein the light-emitting region has a circularly annular shape, and the front electrode has a circular shape; and
    wherein a difference in radius between outer perimeters of the circularly annular light-emitting region and the circular front electrode is 7.1 to 10.7 times the thickness of the current-spreading layer.

2. A semiconductor light-emitting device as set forth in claim 1, further comprising a bonding wire connected to the front electrode.

3. A semiconductor light-emitting device as set forth in claim 1, wherein the radius of the inner perimeter of the circularly annular light-emitting region is 1.3 to 1.7 times the radius of the outer perimeter of the circular front electrode.

4. A semiconductor light-emitting device as set forth in claim 1, wherein the light-emitting region has a quasi-ring-form outer perimeter formed as a square with arced edges.

5. A semiconductor light-emitting device comprising:
    a semiconductor substrate;
    a light-emitting layer formed on the semiconductor substrate;
    a current-blocking layer formed on a part of the light-emitting layer for restricting light-emission;
    a current-spreading layer formed on the current-blocking layer and the other part of the light-emitting layer;
    a front electrode formed on the current-spreading layer;
    a rear electrode formed on a rear side of the semiconductor substrate,
    wherein the current-blocking layer is composed of a central region and an outer region which surrounds the central region via a part of the current-spreading layer, so that a light-emitting region that appears on a front surface of the device has an annular shape;
    wherein the front electrode and the central region of the current-blocking layer are opposed to each other;
    wherein the front electrode has an outer contour that is substantially evenly spaced from an inner contour of the light-emitting region;

wherein the light-emitting region has a circularly annular shape, and the front electrode has a circular shape; and wherein the radius of the inner perimeter of the circularly annular light emitting region is 1.3 to 1.7 times the radius of the outer perimeter of the circular front electrode.

6. A semiconductor light-emitting device comprising:

a semiconductor substrate;

a light-emitting layer formed on the semiconductor substrate;

a current-blocking layer formed on a part of the light-emitting layer for restricting light-emission;

a current-spreading layer formed on the current-blocking layer and the other part of the light-emitting layer;

a front electrode formed on the current-spreading layer;

a rear electrode formed on a rear side of the semiconductor substrate, wherein the current-blocking layer is composed of a central region and an outer region which surrounds the central region via a part of the current-spreading layer, so that a light-emitting region that appears on a front surface of the device has an annular shape; wherein the front electrode and the central region of the current-blocking layer are opposed to each other, wherein the distance between the inner and outer contours of the annular light-emitting region is 25 μm or greater, and the ratio of the maximum to minimum values of said distance is set to 1.4 times or lower.

7. A semiconductor light-emitting device comprising:

a semiconductor substrate;

a light-emitting layer formed on the semiconductor substrate;

a current-blocking layer formed on a part of the light-emitting layer for restricting light-emission;

a current-spreading layer formed on the current-blocking layer and the other part of the light-emitting layer;

a front electrode formed on the current-spreading layer;

a rear electrode formed on a rear side of the semiconductor substrate, wherein the current-blocking layer is composed of a central region and an outer region which surrounds the central region via a part of the current-spreading layer, so that a light-emitting region that appears on a front surface of the device has an annular shape;

wherein the front electrode and the central region of the current-blocking layer are opposed to each other, wherein the annular light-emitting region has an outer contour that is 15 μm or more apart from an outer contour of the semiconductor light-emitting device.

8. A semiconductor light-emitting device comprising:

a semiconductor substrate;

a light-emitting layer formed on the semiconductor substrate;

a current-blocking layer formed on a part of the light-emitting layer for restricting light-emission;

a current-spreading layer formed on the current-blocking layer and the other part of the light-emitting layer;

a front electrode formed on the current-spreading layer;

a rear electrode formed on a rear side of the semiconductor substrate, wherein the current-blocking layer is composed of a central region and an outer region which surrounds the central region via a part of the current-spreading layer, so that a light-emitting region that appears on a front surface of the device has an annular shape;

wherein the front electrode and the central region of the current-blocking layer are opposed to each other;

wherein the front electrode has an outer contour that is substantially equal in shape and size to an inner contour of the annular light-emitting region, or has an outer contour that falls within the inner contour of the light-emitting region;

wherein a distance between the inner and outer contours of the annular light-emitting region is 25 μm or greater, and a ratio of the maximum to minimum values of said distance is set to 1.4 times or lower.

* * * * *